United States Patent [19]

Nagaishi et al.

[11] Patent Number: 5,250,511
[45] Date of Patent: Oct. 5, 1993

[54] LASER EVAPORATION METHOD FOR PREPARING A SUPERCONDUCTING OXIDE THIN FILM

[75] Inventors: Tatsuoki Nagaishi; Hidenori Nakanishi; Saburo Tanaka; Hideo Itozaki, all of Hyogo, Japan

[73] Assignee: Sumitomo Electric Industries, Ltd., Osaka, Japan

[21] Appl. No.: 921,028

[22] Filed: Jul. 29, 1992

[30] Foreign Application Priority Data

Jul. 29, 1991 [JP] Japan .................. 3-211503

[51] Int. Cl.⁵ .................. B05D 3/06; B05D 5/12
[52] U.S. Cl. .................. 505/1; 505/732; 505/730; 427/62; 427/596; 427/314
[58] Field of Search .................. 505/1, 732, 730; 427/62, 63, 596, 314

[56] References Cited

PUBLICATIONS

Krebs et al., "Conditions for oriented growth of Y-Ba-Cu-O and Bi-Sr-Ca-Cu-O films by pulsed laser ablation", J. Appl. Phys. 69(4) Feb. 1991, pp. 2405-2409.
Moodera et al., "In situ deposition of superconducting Bi-Pb-Sr-Ca-Cu-O thin films on MgO (100) substrates by rf magnetron sputtering and laser ablation", App. Phys. Lett. 57(23), Dec. 1990, pp. 2498-2500.

Primary Examiner—Roy King
Attorney, Agent, or Firm—Kerkam, Stowell, Kondracki & Clarke

[57] ABSTRACT

Method for preparing a superconducting thin film of compound oxide having improved properties on a substrate by laser evaporation technique. A target has a surface area which is smaller than an irradiation area of a spot of a laser beam used, so that whole surface of the surface is irradiated with the laser beam.

10 Claims, 1 Drawing Sheet

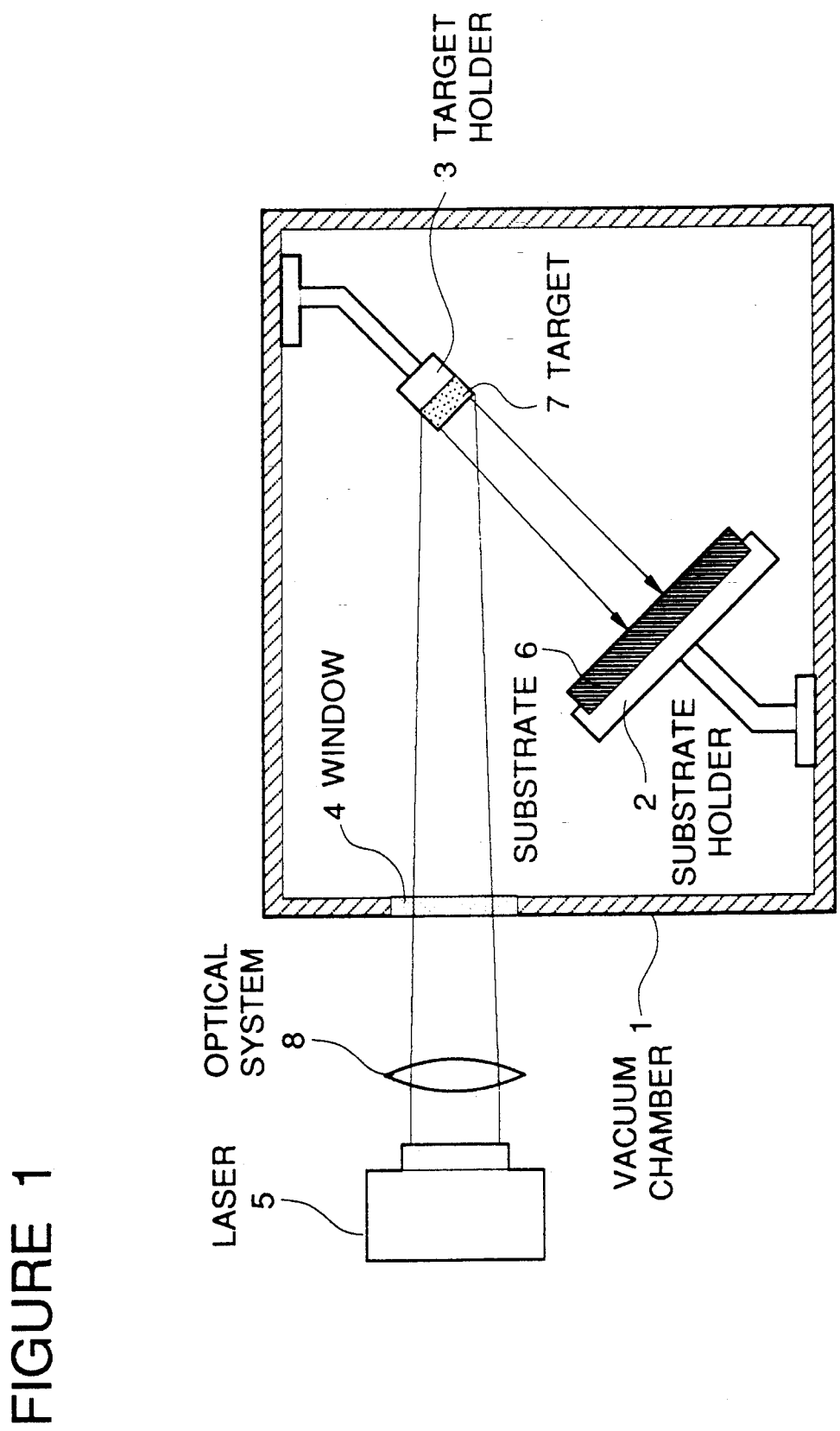

LASER EVAPORATION METHOD FOR PREPARING A SUPERCONDUCTING OXIDE THIN FILM

BACKGROUND OF THE INVENTION

1. Field of the Invention

The present invention relates to an improvement in a method for preparing a superconducting thin film of compound oxide by laser evaporation technique.

2. Description of the Related Art

Superconductivity has been thought, for a long time, to be a phenomenon observable at ultra-low temperatures realized with liquid helium as a cryogen. However, the possibility of an existence of a new type of superconducting material was revealed by Bednorz and Müller, who discovered $(La, Sr)_2CuO_4$ which exhibits superconductivity at 30° K. in 1986. C. W. Chu et al. discovered, in the United States of America, another superconducting material of $YBa_2Cu_3O_{7-\delta}$ having the critical temperature of about 90° K. in 1987. Maeda et al discovered so-called bismuth type superconducting material. And hence, the possibility of an actual utilization of high-Tc superconductors has burst onto the scene because the superconductivity can be realized with cheap cryogen of liquid nitrogen.

The above-mentioned new type superconducting materials were obtained in a form of sintered mass prepared by powder metallurgy. But now, they can be prepared in a thin film form of very high quality.

Laser evaporation technique is one of the most promising techniques because superconducting thin films which exhibit improved superconducting properties can be prepared by the laser evaporation technique with no after-treatment such as annealing of thin films deposited on a substrate.

In the laser evaporation method, fine particles of oxide are observed on a surface of thin film obtained, although the thin film itself exhibits improved superconducting property.

Therefore, an object of the present invention is to provide a novel process for preparing a superconducting thin film of oxide possessing an improved surface property by the laser evaporation technique.

SUMMARY OF THE INVENTION

The present invention provides a method for preparing a superconducting thin film of compound of oxide by laser evaporation technique, characterized by using a target having a surface area which is smaller than an irradiation area of a laser beam used, so that whole surface of the target is irradiated with said laser beam.

In known laser evaporation method, a surface area of the target is larger than an irradiation area of size of a spot created by a laser beam, so that the target is irradiated with the laser beam only partly or locally. However, an outer zone surrounding the laser spot is also heated or energized due to heat-conductance which propagates through a mass of target or from a weakly-heated peripheral zone of the laser spot which is created inevitably by a nature of a laser machine. It is believed that target material scattered or vapourized from such an outside zone condenses and deposits on a surface of the target to produce the fine particles of oxide.

According to the present invention, the surface area of the target has a smaller dimension than an irradiation area or size of a spot of laser beam used, so that whole surface of the target is irradiated with the laser beam to realize a complete plume and hence formation of undeniable fine particles due to the distribution of temperature on the surface of the target can be prevented.

The target can have any shape and the dimension of target depends on an irradiation area of a laser used. For example, a rectangular target having a width of 1 to 8 mm and a length of 1 to 8 mm can be used for usually available lasers. These dimensions, however, depend largely on the shape and the energy output ability of laser machine and hence can be increased when a much more powerful laser is developed.

Distance between the target and the substrate also depends on a desired surface area of thin film to be prepared on the substrate and may be adjusted usually to 50 to 100 mm.

The diameter of spot of a laser beam depends on a laser unit used. Any laser can be used but an excimer laser is usually used. Preferably, an excimer laser whose wave length is shorter than 400 nm such as ArF, KrF and XeCl laser is used.

The laser evaporation technique itself is well-known and usual operational condition can be used in the present invention. Followings are typical operational conditions:

| | |
|---|---|
| Substrate temperature | 600 to 750° C. |
| Gas pressure in chamber | 100 to 1,000 mTorr |
| Laser density | 1.0 to 3.0 J/cm$^2$ |
| Deposition rate: | 10 to 1,000 Å/min |

The substrate is preferably a single crystal substrate of oxide such as MgO, $SrTiO_3$, $LaAlO_3$, $LaGaO_3$ and yttrium stabilized zirconia (YSZ).

The process according to the present invention can be used for preparing thin films of any known high-Tc superconductors such as La-Sr(Ba)-Cu-O, Y-Ba-Cu-O, Bi-Sr-Ca-Cu-O and Tl-Ba-Ca-Cu-O.

The process according to the present invention permits the stable or reproducible preparation of a superconducting thin film of compound oxide possessing improved surface condition and superconducting properties.

BRIEF DESCRIPTION OF THE DRAWING

FIG. 1 illustrates a structure of a film forming apparatus which can be used in the process according to the present invention.

The film forming apparatus shown in FIG. 1 comprises a vacuum chamber 1 in which a substrate holder 2 and a target holder 3 are positioned and a laser 5 which emits a laser beam to a target through a transparent window 4 secured to the vacuum chamber 1.

The substrate holder 2 and the target holder 3 are constructed in such a manner that each of substrate 6 and target 7 can be positioned at desired level, orientation and angle. The laser beam emitted from the laser 5 is converged by an optical system 8.

The target 7 and the target holder 3 have smaller dimensions than conventional ones so that whole surface of the target is irradiated with a laser beam.

DESCRIPTION OF THE PREFERRED EMBODIMENT

Now, the present invention will be described with reference to Examples, but the scope of the invention should not be limited to the Examples.

EXAMPLE 1

A superconducting thin film of Y-type compound oxide is made by using the apparatus shown in FIG. 1.

A thin film was deposited on a (100) plane of MgO single crystal substrate by laser evaporation method. As a target, a sintered body of compound oxide represented by a composition of $YBa_2Cu_3O_y$ was used. The target has a width of 3 mm, a length of 8 mm and a thickness of 1 mm.

The laser has the maximum power of 900 mJ/pulse at a wave length of 193 nm and emits a laser beam having dimension of 10 mm × 30 mm. This laser beam is converged by the optical system 8 to dimension of 3 mm × 9 mm and irradiated an area of 4.2 mm × 9 mm of a surface of the target which is inclined at 45° with respect to the optical axis of the laser beam. Operational conditions used are summarized in Table 1.

TABLE 1

| Substrate temperature | 700 (°C.) |
|---|---|
| Gas pressure | 400 (mTorr) |
| Laser energy density | 1.2 to 2.0 (J/cm$^2$) |
| Film thickness | 2,000 (Å) |

In order to compare the resulting sample (sample 1), the same procedure as above was repeated to prepare another sample (sample 2) in the same apparatus but the dimension of the target was changed to a square target having a side of 10 mm.

The density of oxide particles produced on a surface of the substrate was determined by a scanning electron microscopy (SEM) and the superconducting properties were measured by conventional methods.

The results are summarized in Table 2. The critical current density (Jc) was determined at 77° K.

TABLE 2

| Sample | Critical temperature (K.) | Critical current density (A/cm$^2$) | Density of oxide particle (number/cm$^2$) |
|---|---|---|---|
| 1 | 90 | 5 × 10$^6$ | 5 × 10$^5$ |
| 2 | 90 | 2 × 10$^6$ | 3 × 10$^7$ |

EXAMPLE 2

The same procedure as Example 1 was repeated but the maximum laser power was changed to 400 mJ/pulse and the laser beam was converted to a dimension of 2 mm × 6 mm so that an area of 2.8 mm × 6 mm of a surface of target was irradiated under the same operational conditions as Table 1.

In order to compare the resulting sample (sample 3), the same procedure as above was repeated to prepare another sample (sample 4) in the same apparatus but the dimension of the target was changed to a square target having a side of 10 mm.

The density of oxide particles produced on a surface of the substrate and the superconducting properties were determined by the same method as Example 1.

The results are summarized in Table 3. The critical current density (Jc) was determined at 77° K.

TABLE 3

| Sample | Critical temperature (K.) | Critical current density (A/cm$^2$) | Density of oxide particle (number/cm$^2$) |
|---|---|---|---|
| 3 | 90 | 4 × 10$^6$ | 3 × 10$^5$ |
| 4 | 90 | 2 × 10$^6$ | 3 × 10$^7$ |

What is claimed is:

1. In a method for preparing a superconducting film of compound oxide on a substrate by laser evaporation technique, the improvement comprising using a target having a surface area which is smaller than an irradiation area of a spot of a laser beam used so that the whole surface of said target is irradiated with said laser beam.

2. The method set forth in claim 1 wherein said laser beam is an excimer laser beam having a wavelength of shorter than 400 nm.

3. The method set forth in claim 1 wherein the distance between the target and the substrate is adjusted between 40 and 100 mm.

4. The method set forth in claim 1 wherein the substrate is heated at a temperature between 600° and 750° C.

5. The method set forth in claim 1 wherein a gas pressure in a vacuum chamber is adjusted between 100 and 1,000 mTorr.

6. The method set forth in claim 1 wherein said laser beam has an energy density of between 1.0 and 3.0 J/cm$^2$.

7. The method set forth in claim 1 wherein a deposition rate is adjusted between 10 and 1,000 Å/min.

8. The method set forth in claim 1 wherein the compound oxide is a high-Tc superconductor.

9. The method set forth in claim 8 wherein the compound oxide is selected from the group consisting of La-Sr(Ba)-Cu-O, Y-Ba-Cu-O, Bi-Sr-Ca-Cu-O and Tl-Ba-Ca-Cu-O.

10. The method set forth in claim 1 wherein the substrate is a single crystal substrate.

* * * * *